United States Patent
Jacob et al.

(10) Patent No.: US 9,627,245 B2
(45) Date of Patent: Apr. 18, 2017

(54) METHODS OF FORMING ALTERNATIVE CHANNEL MATERIALS ON A NON-PLANAR SEMICONDUCTOR DEVICE AND THE RESULTING DEVICE

(71) Applicants: GLOBALFOUNDRIES Inc., Grand Cayman (KY); International Business Machines Corporation, Armonk, NY (US); STMicroelectronics, Inc., Coppell, TX (US)

(72) Inventors: Ajey Poovannummoottil Jacob, Watervliet, NY (US); Bruce Doris, Slingerlands, NY (US); Kangguo Cheng, Schenecdtady, NY (US); Nicolas Loubet, Guilderland, NY (US)

(73) Assignees: GLOBALFOUNDRIES Inc., Grand Cayman (KY); International Business Machines Corporation, Armonk, NY (US); STMicroelectronics, Inc., Coppell, TX (US)

( * ) Notice: Subject to any disclaimer, the term of this patent is extended or adjusted under 35 U.S.C. 154(b) by 93 days.

(21) Appl. No.: 14/197,790

(22) Filed: Mar. 5, 2014

(65) Prior Publication Data

US 2015/0255295 A1 Sep. 10, 2015

(51) Int. Cl.
*H01L 21/762* (2006.01)
*H01L 29/66* (2006.01)
(Continued)

(52) U.S. Cl.
CPC .. *H01L 21/76224* (2013.01); *H01L 29/66545* (2013.01); *H01L 29/66795* (2013.01);
(Continued)

(58) Field of Classification Search
None
See application file for complete search history.

(56) References Cited

U.S. PATENT DOCUMENTS

| 8,691,640 B1* | 4/2014 | LiCausi | H01L 29/66795 257/E21.421 |
| 8,759,943 B2* | 6/2014 | Tseng | H01L 29/66795 257/513 |

(Continued)

OTHER PUBLICATIONS

Cheng et al., "Aspect Ratio Trapping Heteroepitaxy for Integration of Germanium and Compound Semiconductors on Silicon," IEEE 2008.

(Continued)

*Primary Examiner* — Abul Kalam
(74) *Attorney, Agent, or Firm* — Amerson Law Firm, PLLC

(57) ABSTRACT

One illustrative method disclosed herein involves, among other things, forming trenches to form an initial fin structure having an initial exposed height and sidewalls, forming a protection layer on at least the sidewalls of the initial fin structure, extending the depth of the trenches to thereby define an increased-height fin structure, with a layer of insulating material over-filling the final trenches and with the protection layer in position, performing a fin oxidation thermal anneal process to convert at least a portion of the increased-height fin structure into an isolation material, removing the protection layer, and performing an epitaxial deposition process to form a layer of semiconductor material on at least portions of the initial fin structure.

22 Claims, 13 Drawing Sheets

(51) Int. Cl.
*H01L 29/78* (2006.01)
*H01L 29/49* (2006.01)
*H01L 29/51* (2006.01)
*H01L 29/04* (2006.01)
*H01L 29/165* (2006.01)

(52) U.S. Cl.
CPC ........ *H01L 29/7853* (2013.01); *H01L 29/045* (2013.01); *H01L 29/165* (2013.01); *H01L 29/4966* (2013.01); *H01L 29/517* (2013.01)

(56) References Cited

U.S. PATENT DOCUMENTS

| | | | |
|---|---|---|---|
| 8,766,363 B2* | 7/2014 | Cheng | H01L 21/845 257/255 |
| 9,035,430 B2* | 5/2015 | Vega | H01L 21/3081 257/192 |
| 9,093,496 B2* | 7/2015 | Jacob | H01L 21/76243 |
| 2009/0278196 A1* | 11/2009 | Chang | H01L 21/823412 257/328 |
| 2009/0321836 A1 | 12/2009 | Wei et al. | |
| 2010/0072515 A1 | 3/2010 | Park et al. | |
| 2011/0097881 A1 | 4/2011 | Vandervorst et al. | |
| 2011/0183508 A1 | 7/2011 | Chan et al. | |
| 2011/0193141 A1* | 8/2011 | Lin | H01L 29/045 257/255 |
| 2013/0020640 A1* | 1/2013 | Chen | H01L 29/66795 257/347 |
| 2013/0270628 A1 | 10/2013 | Huang et al. | |
| 2014/0091394 A1* | 4/2014 | Li | H01L 21/823431 257/368 |
| 2014/0124863 A1* | 5/2014 | Cheng | H01L 21/845 257/350 |
| 2014/0175543 A1* | 6/2014 | Glass | H01L 21/823431 257/337 |
| 2014/0332861 A1* | 11/2014 | Cheng | H01L 29/66795 257/288 |
| 2015/0021690 A1* | 1/2015 | Jacob | H01L 27/0886 257/347 |
| 2015/0243755 A1* | 8/2015 | Cheng | H01L 29/66795 257/288 |

OTHER PUBLICATIONS

Houghton et al., "Equilibrium critical thickness for $Si_{1-x}Ge_x$ strained layers on (100) Si," Appl. Phys. Lett., 56:460-62, Jan. 1990.

Jain et al., "A new study of critical layer thickness, stability and strain relaxation in pseudomorphic $Ge_xSi_{1-x}$ strained epilayers," Philosophical Magazine A, 65:1151-67, 1992.

Kasper et al., "Strain relaxation of metastable SiGe/Si: Investigation with two complementary X-ray techniques," Journal of Applied Physics, 111:063507, 2012.

Kim et al., "Increased critical thickness for high Ge-content strained SiGe-on-Si using selective epitaxial growth," Applied Physics Letters, 97:262106, 2012.

Paul, "Silicon-Germanium Strained Layer Materials in Microelectronics," Advanced Materials, 11:191-204, 1999.

Paul, "Si/SiGe heterostructures: From material and physics to devices and circuits," Review Article submitted to Semicond. Sci. Technol.

* cited by examiner

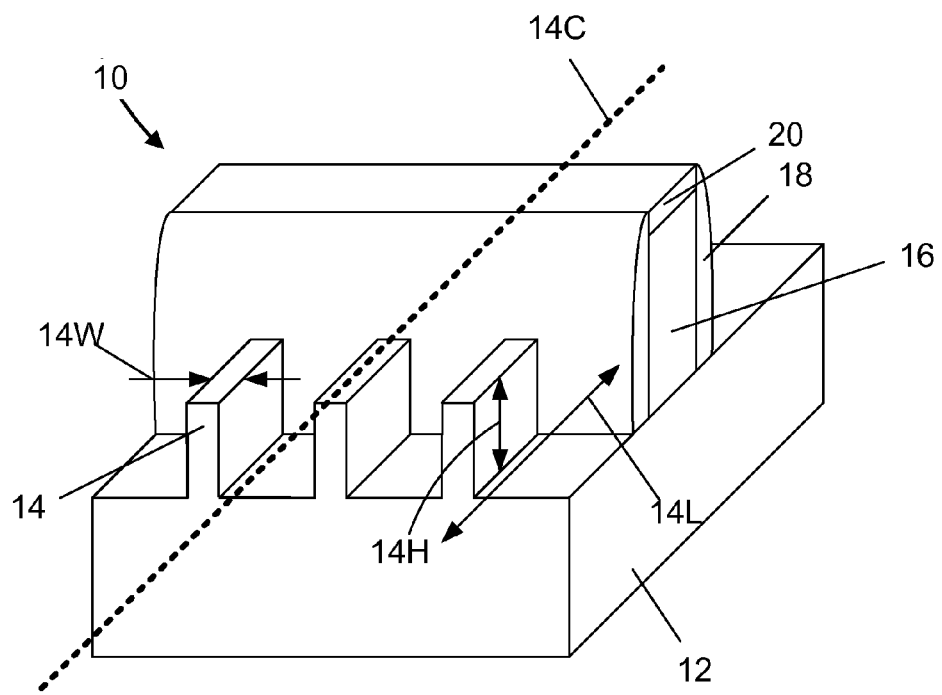
(Prior Art) Figure 1A
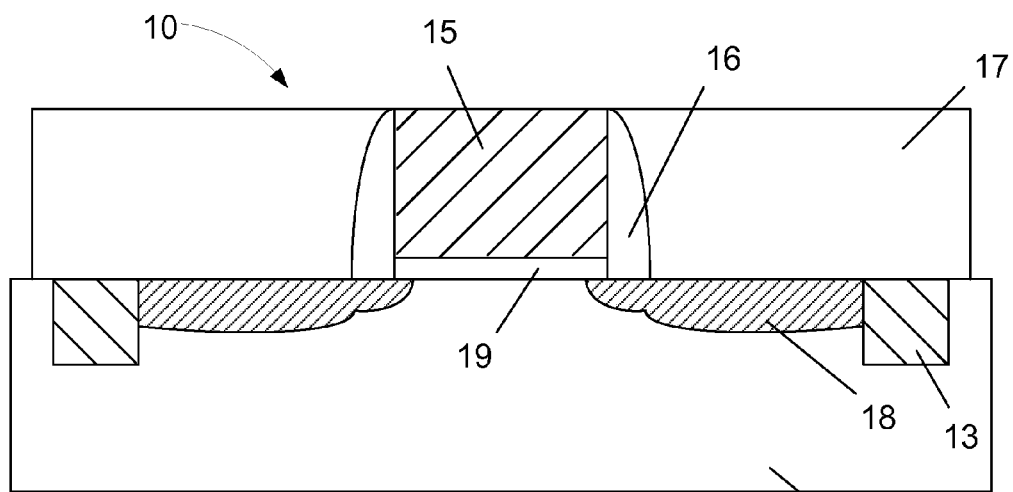
(Prior Art) Figure 1B

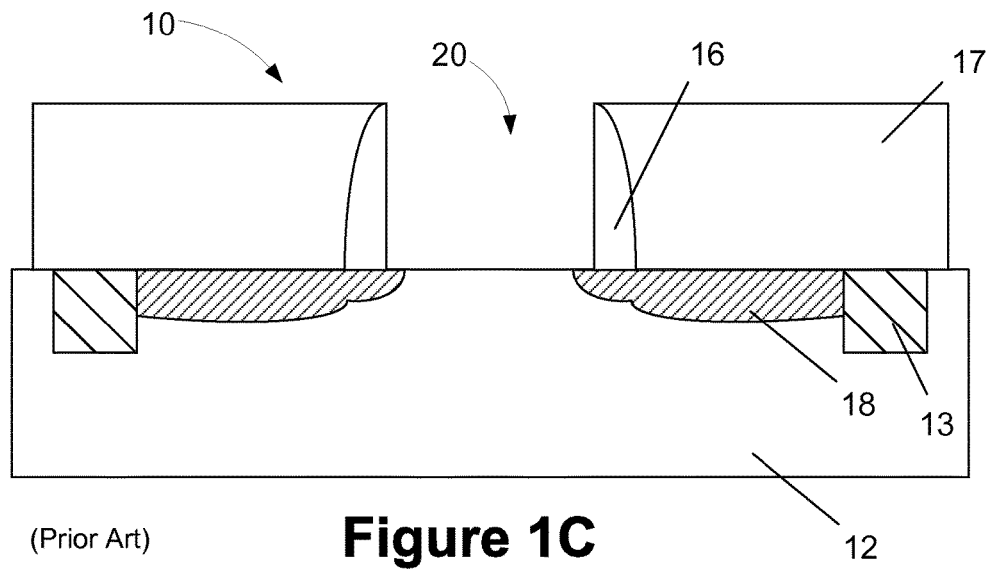
(Prior Art) Figure 1C
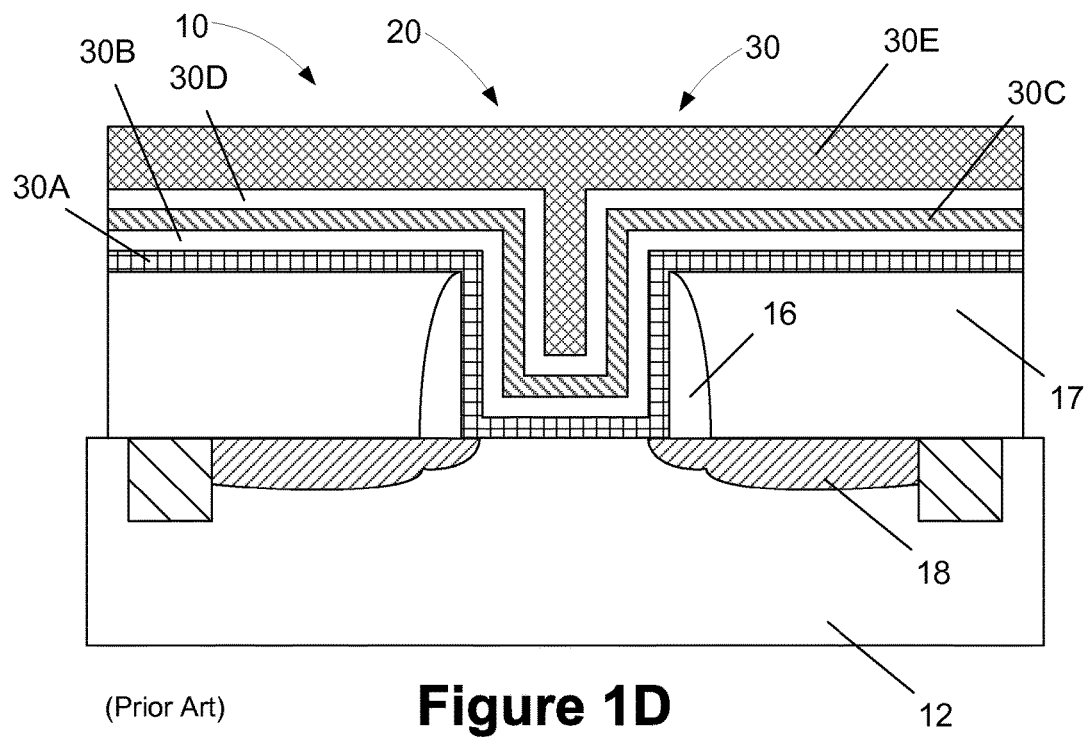
(Prior Art) Figure 1D

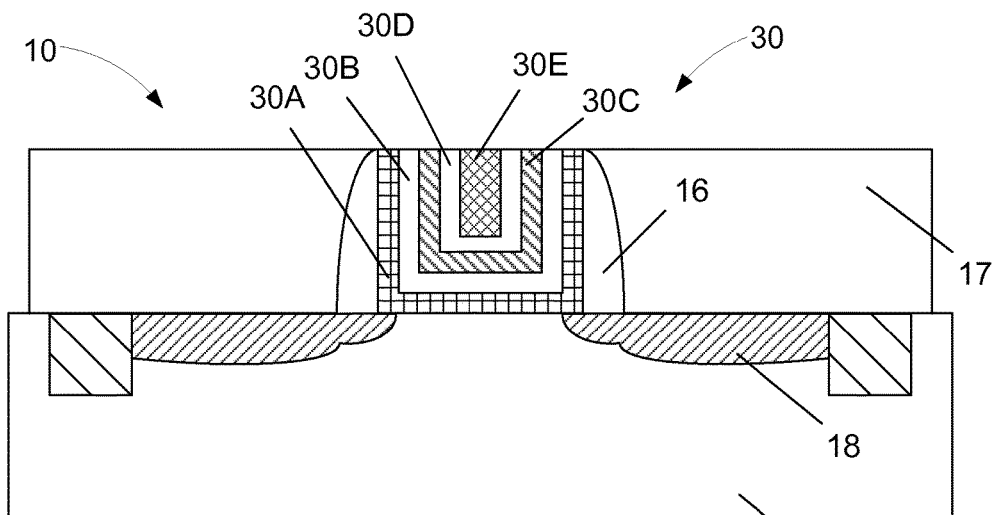
(Prior Art) Figure 1E
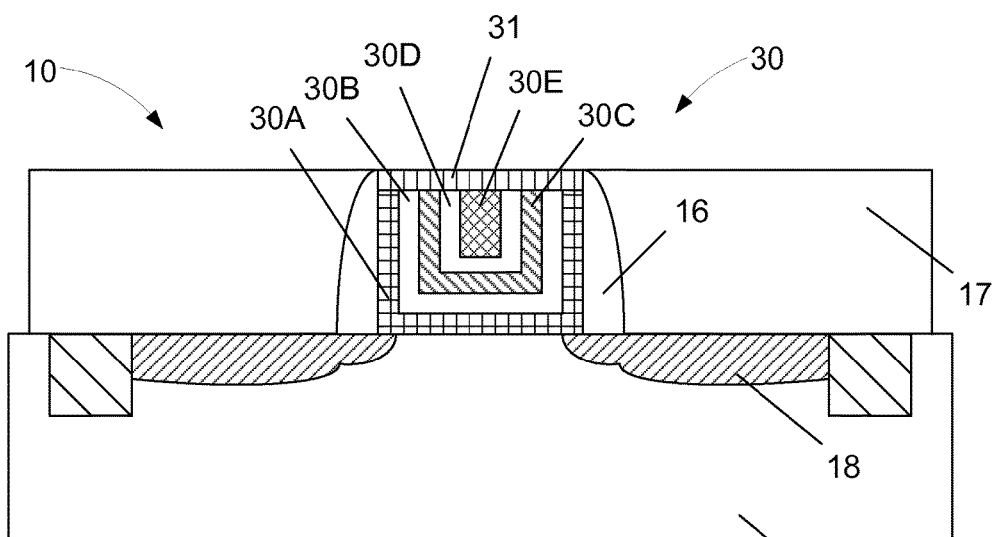
(Prior Art) Figure 1F

METHODS OF FORMING ALTERNATIVE CHANNEL MATERIALS ON A NON-PLANAR SEMICONDUCTOR DEVICE AND THE RESULTING DEVICE

BACKGROUND OF THE INVENTION

1. Field of the Invention

Generally, the present disclosure relates to the manufacture of semiconductor devices, and, more specifically, to various methods of forming alternative channel semiconductor materials on a non-planar semiconductor device and the resulting device structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device 10. In this example, the FinFET device 10 includes three illustrative fins 14, a gate structure 16, sidewall spacers 18 and a gate cap layer 20. The gate structure 16 is typically comprised of a layer of gate insulating material (not separately shown), e.g., a layer of high-k insulating material or silicon dioxide, and one or more conductive material layers (e.g., metal and/or polysilicon) that serve as the gate electrode for the device 10. The fins 14 have a three dimensional configuration: a height 14H, a width 14W and a long-axis or axial length 14L. The axial length 14L corresponds to the direction of current travel in the device 10 when it is operational. The dashed line 14C depicts the long-axis or centerline of the fins 14. The portions of the fins 14 covered by the gate structure 16 are the channel regions of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes. The process of increasing the size of or merging the fins 14 in the source/drain regions of the device 10 is performed to reduce the resistance of source/drain regions and/or make it easier to establish electrical contact to the source/drain regions. Even if an epi "merge" process is not performed, an epi growth process will typically be performed on the fins 14 to increase their physical size.

In the FinFET device 10, the gate structure 16 may enclose both sides and the upper surface of all or a portion of the fins 14 to form a tri-gate structure so as to use a channel having a three-dimensional structure instead of a planar structure. In some cases, an insulating cap layer (not shown), e.g., silicon nitride, is positioned at the top of the fins 14 and the FinFET device 10 only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins 14, i.e., the vertically oriented sidewalls and the top upper surface of the fin, form a surface inversion layer or a volume inversion layer that contributes to current conduction. In a FinFET device, the "channel-width" is estimated to be about two times ($2x$) the vertical fin-height of the fin 14 plus the width of the top surface of the fin 14, i.e., the fin width. Multiple fins can be formed in the same foot-print as that of a planar transistor device. Accordingly, for a given plot space (or foot-print), FinFET devices tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures 16 for such FinFET devices 10 may be manufactured using so-called "gate-first" or "replacement gate" (gate-last) manufacturing techniques.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1B, the device 10 includes a sacrificial gate insulation layer 19, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 19 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 19 to thereby define a replacement gate cavity 20 where a replacement gate structure will subsequently be formed. Typically, the sacrificial gate insulation layer 19 is removed as part of the replacement gate technique, as depicted herein. However, the sacrificial gate insulation layer 19 may not be removed in all applications. Even in cases where the sacrificial gate insulation layer 19 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices.

Device designers are currently investigating using alternative semiconductor materials, such as so-called III-V materials, to manufacture FinFET devices, which are intended to enhance the performance capabilities of such devices, e.g., to enable low-voltage operation. For example, one prior art technique involved performing an epitaxial deposition process to blanket-deposit a III-V material on a silicon semiconducting substrate and thereafter performing an etching process to define the fins. Other prior art techniques involved utilization of selective epitaxial growth in trench/line structures formed on an otherwise planar surface. However, these methods have not achieved widespread adoption due to a variety of reasons. What is desired is a reliable and repeatable methodology for forming fins for FinFET devices that are comprised of an alternative material to that of the substrate. However, the integration of such alternative materials on silicon substrates (the dominant substrates used in the industry) is a non-trivial matter due to, among other issues, the large difference in lattice constants between such materials and silicon.

The present disclosure is directed to various methods of forming alternative channel semiconductor materials on a non-planar semiconductor device and the resulting device structure that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming alternative channel semiconductor materials on a non-planar semiconductor device and the resulting device structure. One illustrative method disclosed herein involves, among other things, forming a plurality of initial trenches having an initial depth in a semiconductor substrate, wherein the initial trenches define an initial fin structure having an initial exposed height and sidewalls, forming a protection layer on at least the sidewalls of the initial fin structure, after forming the protection layer, performing a second etching process to extend the initial depth of the initial trenches into the substrate and thereby form a plurality of final trenches having a final depth that is greater than the initial depth and to define an increased-height fin structure that has an overall height greater that the height of the initial fin structure, forming a layer of insulating material so as to over-fill the final trenches, with the layer of insulating material over-filling the final trenches, and with the protection layer in position on at least a portion of the initial fin structure, performing a fin oxidation thermal anneal process to convert at least a portion of the increased-height fin structure into an isolation material that extends under an entire axial length of the increased-height fin structure in a gate length direction of the device, after performing the fin oxidation thermal anneal process, removing the protection layer and performing an epitaxial deposition process to form a layer of semiconductor material on at least portions of the initial fin structure.

BRIEF DESCRIPTION OF THE DRAWINGS

The disclosure may be understood by reference to the following description taken in conjunction with the accompanying drawings, in which like reference numerals identify like elements, and in which:

FIG. 1A depicts an illustrative example of a prior art FinFET device with various features identified for reference purposes;

FIGS. 1B-1F simplistically depict one illustrative prior art method for forming a replacement gate structure using a replacement gate technique on a planar transistor device;

Figure 2A:
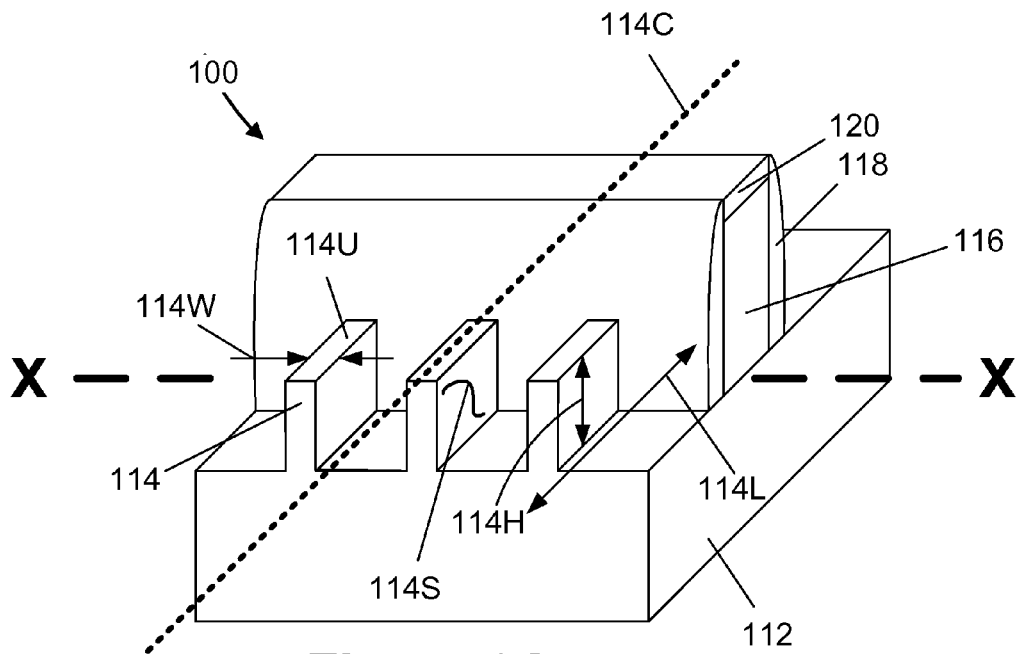
FIGS. 2A-2D depict illustrative examples of how the non-planar semiconductor devices disclosed herein may be, but are not required to be, oriented on semiconductor substrates.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming alternative channel semiconductor materials on a non-planar semiconductor device and the resulting device structure. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIG. 2A is a perspective view of an illustrative FinFET semiconductor device 100 that may be formed in accordance with the methods disclosed herein. The device 100 is formed above a semiconductor substrate 112. The illustrative substrate 112 may be a bulk semiconductor substrate, or it may be the active layer of a so-called SOI (silicon-on-insulator) substrate or a so-called SGOI (silicon/germanium-on-insulator) substrate. Thus, the terms "substrate," "semiconductor substrate" or "semiconducting substrate" should be understood to cover all semiconductor materials and all forms of such semiconductor materials. The device 100 may be either a P-type device or an N-type device.

With continuing reference to FIG. 2A, in this example, the device 100 includes three illustrative fins 114, a gate structure 116, outermost sidewall spacers 118 and a gate cap layer 120. The gate structure 116 is typically comprised of a layer of gate insulating material (not separately shown in FIG. 2A), e.g., a layer of high-k insulating material or silicon dioxide, and one or more conductive material layers (e.g., metal and/or polysilicon) that serve as the gate electrode for the device 100. The gate structure 116 may be formed using either "replacement gate" or "gate-first" manufacturing techniques. Of course, as will be appreciated by those skilled in the art after a complete reading of the present application, the device disclosed herein may be formed with any desired number of fins 114.

The fins 114 have a three dimensional configuration: a height 114H, a width 114W and a long-axis or axial length 114L. The axial length 114L corresponds to the direction of current travel in the device 100 when it is operational. The dashed line 114C depicts the long-axis or centerline of the fins 114. The gate structure 116 is positioned above the channel regions of the device 100. In a conventional process flow, the portions of the fins 114 that are positioned outside of the outermost spacers 118, i.e., in the source/drain regions of the device 100, may be increased in size or even merged together (may be merged or unmerged epi) by performing one or more epitaxial growth processes. The process of increasing the size of or merging the fins 114 in the source/drain regions of the device 100 is typically performed to, among other things, reduce the resistance of source/drain regions and/or make it easier to establish electrical contact to the source drain regions. In many cases, the fins 114 may be undoped or have a low dopant concentration, which tends to result in poor or less than desirable electrical contact. Even if an epi "merger" process is not performed, an epi growth process will typically be performed on the fins 114 to increase their physical size. View "X-X" in FIG. 2A depicts the locations where various cross-sectional views of the devices disclosed herein may be taken in the drawings discussed below, i.e., through what will become a source/drain region for the device 100 in a direction that is perpendicular to the long axis 114L of the fins 114 (or stated another way, in a direction that is parallel to the gate width direction of the device 100).

In some cases discussed herein, reference will be made to orienting the sidewalls and/or long axis 114L of the fins 114 of the device 100 in a certain crystallographic orientation. The methods disclosed herein involve formation of an alternative semiconductor material on the fins 114 in both the channel region and source/drain regions of the device 100, as described more fully below. The epitaxial deposition process that is performed to form such alternative semiconductor material may be easier to control when the fins 114 are formed on substrates 112 oriented as described herein. Additionally, uniform epi growth yields more uniform dopant incorporation because the concentration of dopant material of even the amount (%) of germanium may depend upon the crystalline orientation of the fins.

Figure 2B:
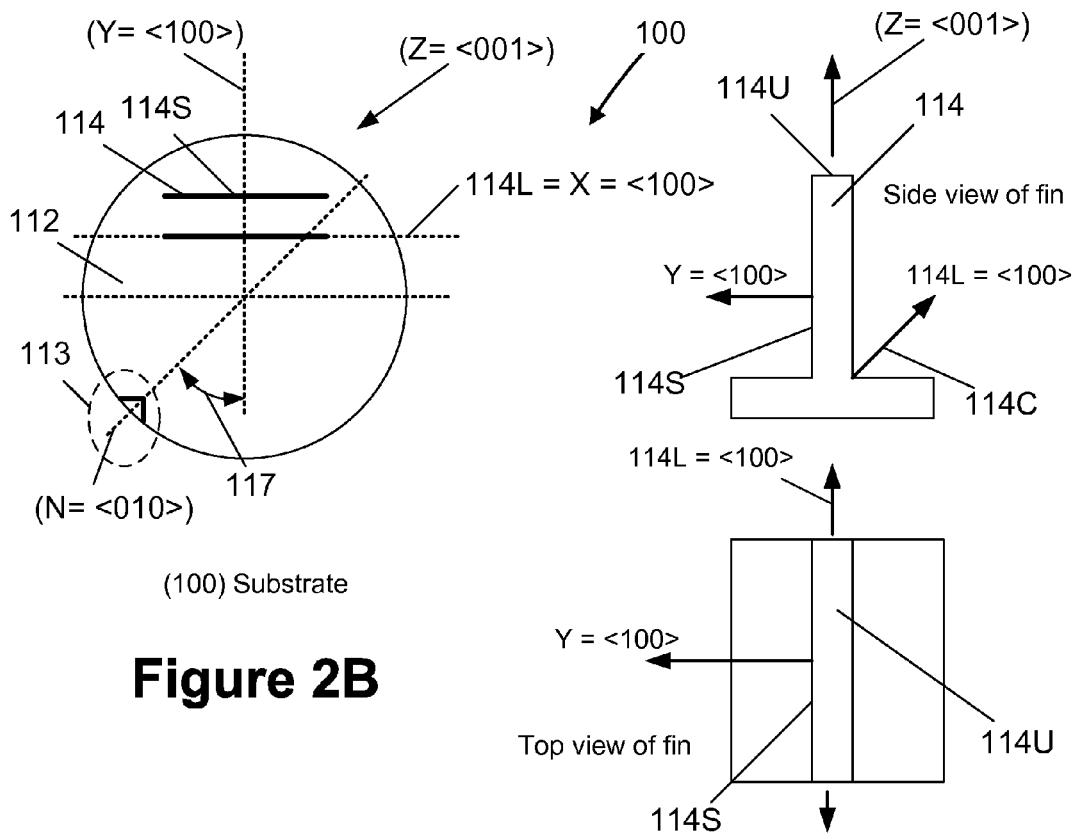

FIG. 2B depicts one illustrative example disclosed herein of how the fins 114 of the FinFET device 100 may be oriented relative to the crystallographic orientation of the substrate material. However, as will be appreciated by those skilled in the art after a complete reading of the present application, the inventions disclosed herein are not limited to use with any particular type of substrate with any particular crystalline structure or to the orientation of the fins 114 on such a substrate relative to the crystallographic orientation of the substrate material. FIG. 2B depicts an illustrative substrate 112 having a (100) crystalline structure, wherein the use of "( )" denotes a specific plane. Such (100) substrates are well known in the art and are generally commercially available from a number of manufacturers. As is well known to those skilled in the art, the (100) substrate 112 is manufactured in such a manner that the crystalline planes within the substrate 112 are arranged in a certain ordered arrangement. As used herein, the "< >" designation reflects an identification of a family of equivalent directions. The plan view in FIG. 2B reflects one illustrative embodiment disclosed herein for orienting the illustrative fins 114 of the device 100 relative to various crystallographic structures of the (100) substrate 112. As is customary, the (100) substrate 112 includes a notch 113 that is aligned with the <010> crystallographic plane, i.e., the notched plane "N" of the substrate 112. In this embodiment, the (100) substrate 112 is rotated 45 degrees relative to the vertical, as indicated by the angle 117, and the fins 114 are manufactured such that the long axis 114L of the fins 114 is oriented at 45 degrees relative to the notched plane "N" of the (100) substrate 112. For example, FIG. 2B depicts a plan view of such an illustrative (100) substrate 112 with a surface normal "Z" in the (100) crystalline plane. As thus oriented, the sidewalls 114S of the fins 114 are oriented in the <100> crystallographic direction in the "Y" or vertical direction (in the plan view) and the long axis 114L of the fins 114 are oriented in the <100> crystallographic direction in the "X" or horizontal direction (in the plan view). The upper surface 114U of the fins 114 are oriented in the <001> crystallographic direction in the "Z" direction i.e., in the direction into and out of the plan view drawing in FIG. 2B. Also depicted in FIG. 2B is a cross-sectional view and a top view of an illustrative fin structure 114 showing the crystalline orientation of various aspects of the fin 114 that is formed in the (100) substrate 112 with the notch 113 rotated 45 degrees relative to the vertical. As can be seen in these views, the long axis 114L of the fin 114 is positioned in the <100> crystallographic direction of the crystalline structure of the substrate 112, while the sidewalls 114S of the fins 114 are also positioned in the <100> direction of the crystalline structure of the rotated (100) substrate 112.

Figure 2C:
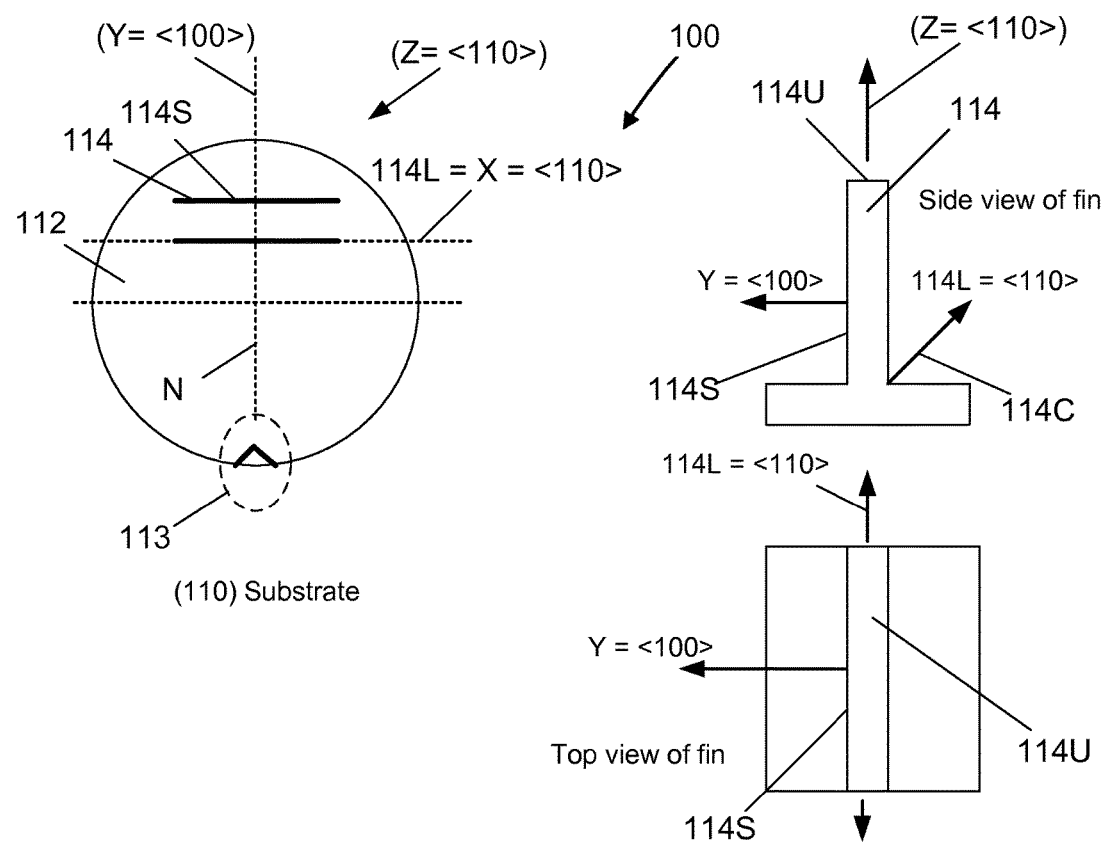

FIG. 2C depicts another illustrative example disclosed herein of how the fins 114 of the device 100 may be oriented relative to the crystallographic orientation of the substrate 112. FIG. 2C depicts an illustrative substrate 112 having a (110) crystalline structure, wherein the use of "( )" denotes a specific plane. Such (110) substrates 112 are well known in the art and are generally commercially available from a number of manufacturers. The plan view in FIG. 2C reflects one illustrative embodiment disclosed herein for orienting the illustrative fins 114 of the device 100 relative to various crystallographic structures of the (110) substrate 112. As is customary, the (110) substrate 112 includes a notch 113 that is aligned with the <100> crystallographic plane, i.e., the notched plane "N" of the substrate 112. In this embodiment, the (110) substrate 112 is not rotated relative to the vertical, and the fins 114 are manufactured such that the long axis 114L of the fins 114 is oriented perpendicular relative to the notched plane "N" of the (110) substrate 112. For example, FIG. 2C depicts a plan view of such an illustrative (110) substrate 112 with a surface normal "Z" in the (110) crystalline plane. As thus oriented, the sidewalls 114S of the fins 114 are oriented in the <100> crystallographic direction in the "Y" or vertical direction (in the plan view) and the long axis 114L of the fins 114 are oriented in the <110> crystallographic direction in the "X" or horizontal direction (in the plan view). The upper surface 114U of the fins 114 are oriented in the <110> crystallographic direction in the "Z" direction i.e., in the direction into and out of the plan view drawing in FIG. 2C. Also depicted in FIG. 2C is a cross-sectional view and a top view of an illustrative substrate fin structure 114 showing the crystalline orientation of various aspects of the fin 114 that is formed in the non-rotated (110) substrate 112. As can be seen in these views, the long axis 114L of the fin 114 is positioned in the <110> crystallographic direction of the crystalline structure of the substrate 112, while the sidewalls 114S of the fins 114 are positioned in the <100> direction of the crystalline structure of the non-rotated (110) substrate 112.

Figure 2D:
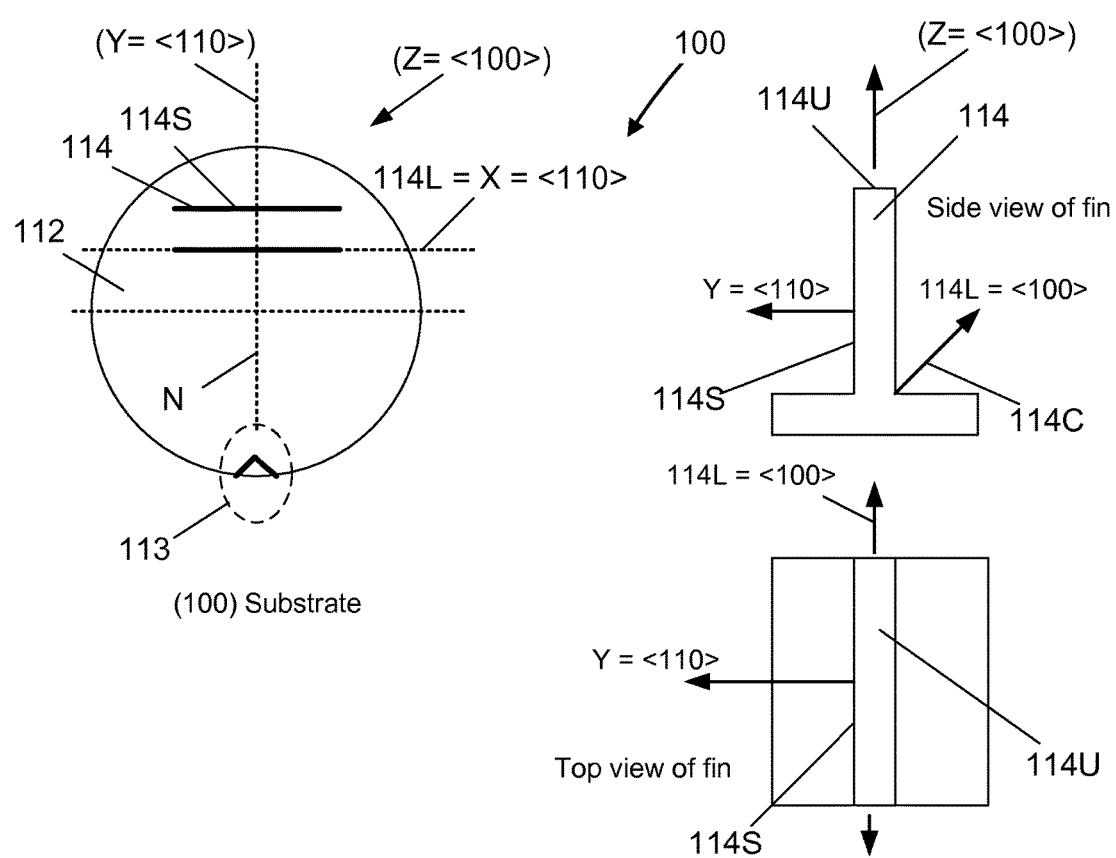

FIG. 2D depicts yet another illustrative example disclosed herein of how the fins 114 of the device 100 may be oriented relative to the crystallographic orientation of the substrate material. FIG. 2D depicts an illustrative substrate 112 having a (100) crystalline structure, wherein the use of "( )" denotes a specific plane. The plan view in FIG. 2D reflects one illustrative embodiment disclosed herein for orienting the illustrative fins 114 of the device 100 relative to various crystallographic structures of the (100) substrate 112. As is customary, the (100) substrate 112 includes a notch 113 that is aligned with the <110> crystallographic plane, i.e., the notched plane "N" of the substrate 112. In this embodiment, the (100) substrate 112 is not rotated relative to the vertical (i.e., zero degrees of rotation), and the fins 114 are manufactured such that the long axis 114L of the fins 114 is oriented transverse or normal relative to the notched plane "N" of the (100) substrate 112. For example, FIG. 2D depicts a plan view of such an illustrative (100) substrate 112 with a surface normal "Z" in the (100) crystalline plane. As thus oriented, the sidewalls 114S of the fins 114 are oriented in the <110> crystallographic direction in the "Y" or vertical direction (in the plan view) and the long axis 114L of the fins 114 are oriented in the <110> crystallographic direction in the "X" or horizontal direction (in the plan view). The upper surface 114U of the fins 114 are oriented in the <100> crystallographic direction in the "Z" direction i.e., in the direction into and out of the plan view drawing in FIG. 2D. Also depicted in FIG. 2D is a cross-sectional view and a top view of an illustrative fin structure 114 showing the crystalline orientation of various aspects of the fin 114 that is formed in the non-rotated (100) substrate 112. As can be seen in these views, the long axis 114L of the fin 114 is positioned in the <110> crystallographic direction of the crystalline structure of the substrate 112, while the sidewalls 114S of the fins 114 are positioned in the <110> direction of the crystalline structure of the non-rotated (100) substrate 112.

One illustrative process flow that may be employed to form the device 100 on either the rotated (100) substrate 112, the non-rotated (100) substrate or the non-rotated (110) substrate 112 will now be described with reference to FIGS. 3A-3L. In addition, the methods disclosed herein may be employed to form the disclosed devices on other types of substrates that may be oriented in a manner different than those orientations discussed above. Of course, other process flows may be used to form the fins 114 of the device 100 disclosed herein. Thus, the methods and devices disclosed herein should not be considered to be limited to the illustrative process flow described herein nor to the illustrative substrates/orientations discussed above. For ease of illustration, only a single fin 114 will be depicted in FIGS. 3A-3L. Of course, using the methods disclosed herein, a FinFET device may be formed with any desired number of fins. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. FIGS. 3A-3I depict the illustrative example where the device is formed on either a non-rotated (100) substrate or a non-rotated (110) substrate.

Figure 3A:
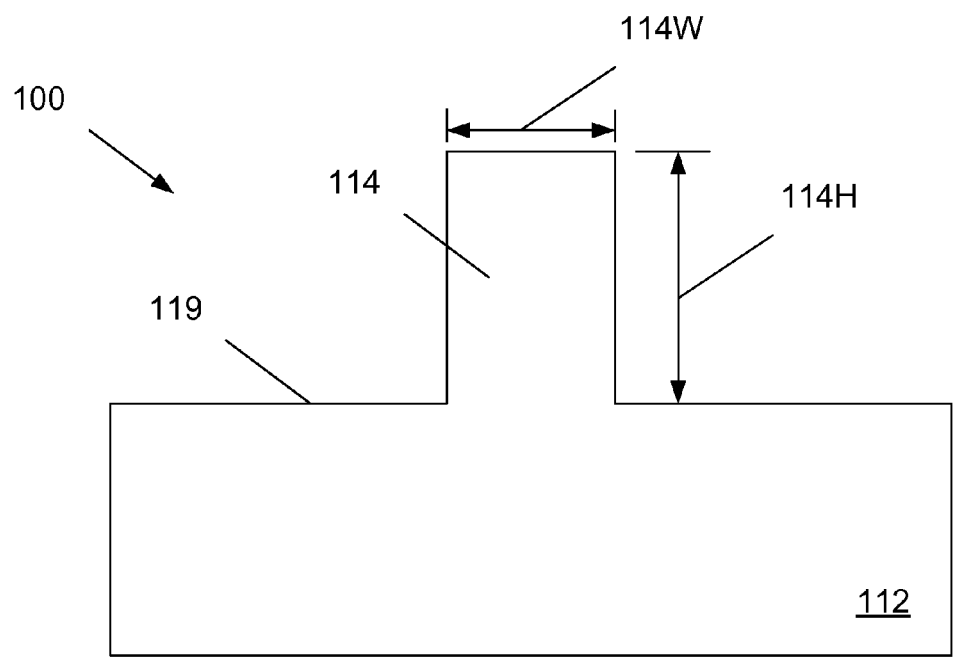
FIG. 3A-3L depict various illustrative methods of forming alternative channel semiconductor materials on non-planar semiconductor devices and the resulting device structures.

At the point of fabrication depicted in FIG. 3A, one or more etching processes were performed on the substrate 112 through a patterned etch mask (not shown) to define a plurality of initial trenches 119 in the substrate 112. The formation of the initial trenches 119 results in the formation of an illustrative initial fin structure 114. Of course, as noted above, the device 100 may be formed with any desired number of fins 114. The height 114H and width 114W of the initial fin 114 may vary depending upon the particular application. In one illustrative embodiment, based on current day technology, the width of the initial fin 114 may range from about 10 nm—several micrometers. In some embodiments, the initial fin 114 may have a width within the range of about 3-30 nm and an initial height 114H that may fall within the range of about 10-60 nm.

In the illustrative examples depicted in the attached figures, the trenches 119 and the fins 114 are all of a uniform size and shape. However, such uniformity in the size and shape of the trenches 119 and the fins 114 may not be required to practice at least some aspects of the inventions disclosed herein. In the example disclosed herein, the trenches 119 are depicted as having been formed by performing an anisotropic etching process that results in the trenches 119 having a schematically depicted, generally rectangular configuration with substantially vertical sidewalls. In an actual real-world device, the sidewalls of the trenches 119 may be somewhat inwardly tapered, although that configuration is not depicted in the attached drawings. In some cases, the trenches 119 may have a reentrant profile near the bottom of the trenches 119. To the extent the trenches 119 are formed by performing a wet etching process, the trenches 119 may tend to have a more rounded configuration or non-linear configuration as compared to the generally rectangular configuration of the trenches 119 that are formed by performing an anisotropic etching process. Thus, the size and configuration of the trenches 119, and the manner in which they are made, should not be considered a limitation of the present invention. For ease of disclosure, only the substantially rectangular trenches 119 and fins 114 will be depicted in subsequent drawings. In the case of fins 114 having a tapered cross-sectional configuration (not shown), the sidewalls 114S of such tapered fins may be positioned slightly out of the <100> direction noted above due to the tapered shape of the fins 114. The crystallographic orientation of the sidewall will vary depending upon the type and orientation of the substrate (<110> in the case of a non-rotated (100) substrate or <100> in the case of non-rotated (110) substrates). Of course, if desired, the fins 114 may be manufactured to have more vertically oriented sidewalls or even substantially vertical sidewalls, as depicted in the attached drawings. The more vertical the sidewalls 114S of the fins 114, the more closely the sidewalls 114S will be positioned in the <100> direction of the substrate 112. Thus, when it is stated herein and in the attached claims that the long-axis 114L or centerline of the fins 114 disclosed herein are positioned in the <100> direction of the substrate 112, it is intended to cover fins 114 so oriented irrespective of their cross-sectional configuration, i.e., irrespective of whether the fins 114 are tapered or rectangular or any other shape when viewed in cross-section.

Figure 3B:
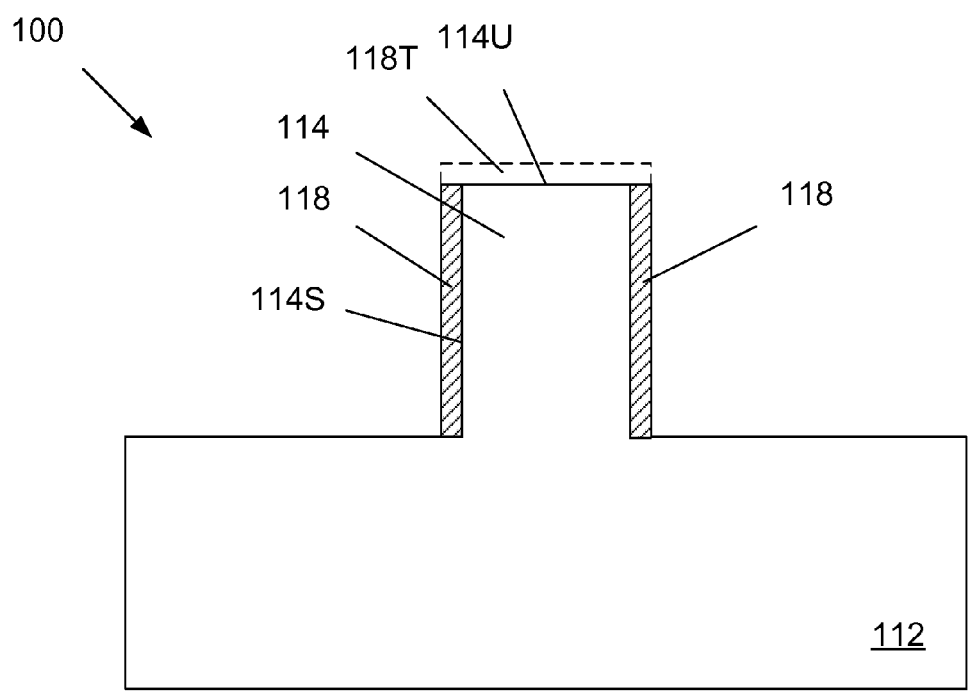

FIG. 3B depicts the FinFET device 100 after a protective layer 118 has been formed on at least the sidewalls 114S of the initial fin 114. In some embodiments, the protective layer 118 may also include an upper portion 118T (depicted in dashed lines) that is formed above the upper surface 114U of the initial fin 114. In general, the protective layer 118 is formed so as to prevent the oxidation of the underlying portions of the initial fin 114, as described more fully below. In one illustrative embodiment, the protective layer 118 may be comprised of a material such as, for example, silicon nitride. In some cases, the protective layer 118 may be formed by depositing a layer of the protective material using a conformal deposition process (e.g., a conformal ALD or CVD process) and thereafter an anisotropic etching process may be performed to define the protective layer 118 that is positioned proximate on at least the sidewalls 114S of the initial fin 114. The portion 118T may be a part of a layer of material that was formed above the substrate prior to forming the trenches 119. The thickness of the protective layer 118 may vary depending upon the particular application, e.g., 2-4 nm.

Figure 3C:
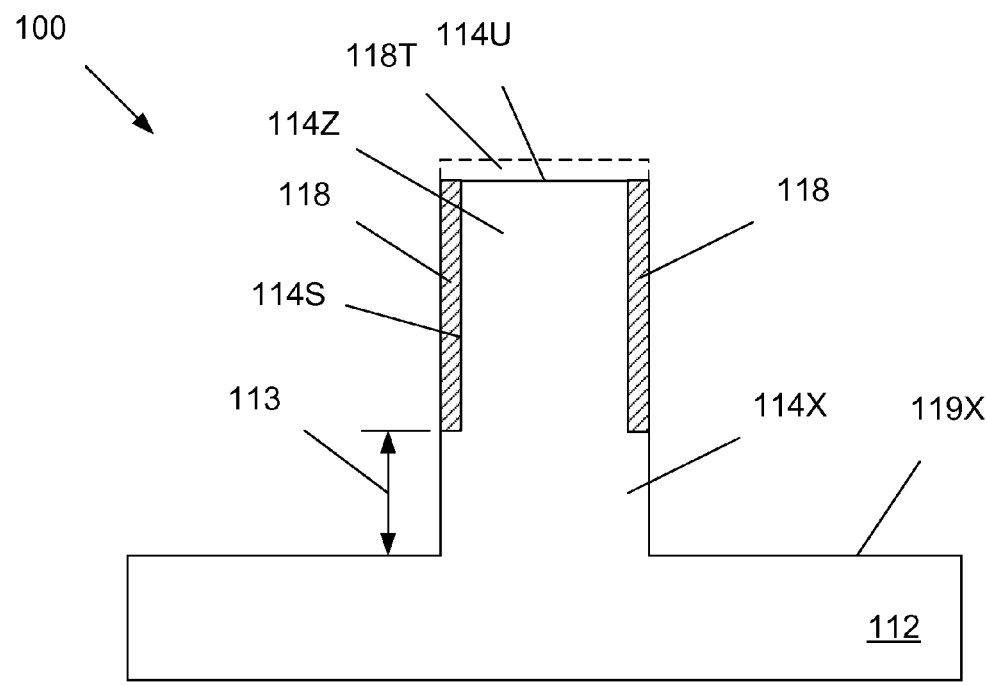

FIG. 3C depicts the FinFET device 100 after one or more etching processes, e.g., anisotropic etching processes, were performed to extend the depth of the initial trenches 119 in the substrate 112. This etching process increases the depth of the initial trenches 119 and results in the formation of final trenches 119X that are deeper than the initial trenches 119. The etching process also results in the formation of an increased height fin 114Z and exposes a portion 114X of the increased height fin 114Z for further processing. The amount 113 of the increased height fin 114Z that is exposed may vary depending upon the particular application, e.g., 10-100 nm.

Figure 3D:
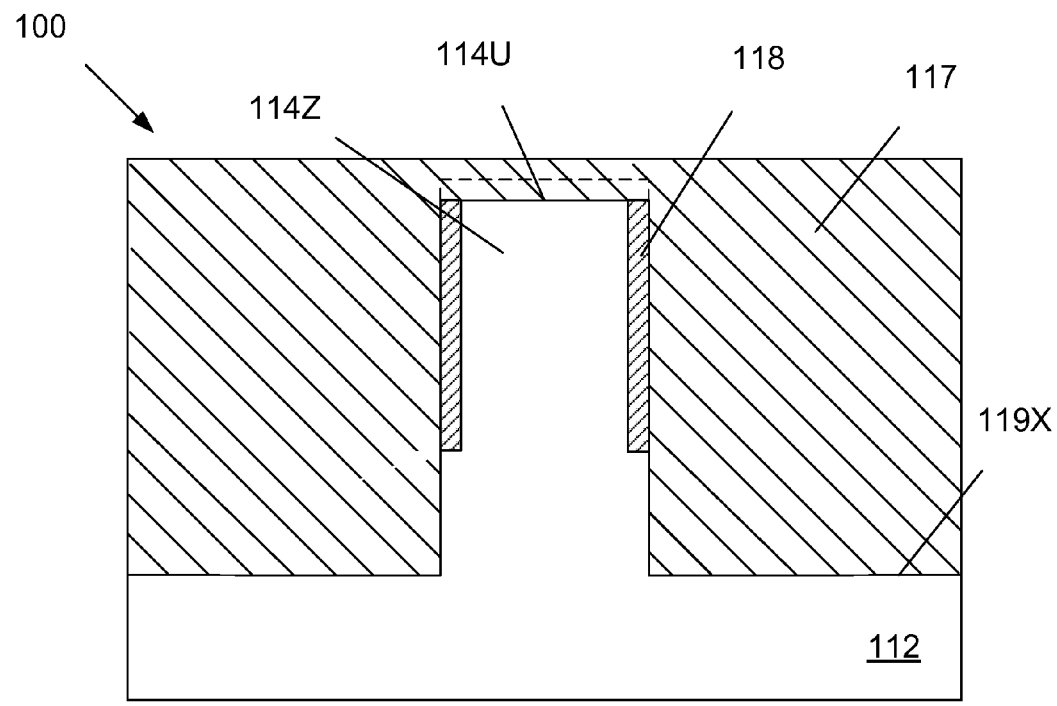

Thereafter, as shown in FIG. 3D, the final trenches were overfilled with an insulating material 117. The layer of insulating material 117 discussed herein may be comprised of a variety of different materials, such as, for example, silicon dioxide, an oxygen-rich silicon dioxide, etc., or multiple layers thereof, etc., and it may be formed by performing a variety of techniques, e.g., chemical vapor deposition (CVD), etc. Although not depicted, if desired, a chemical mechanical polishing (CMP) process may be performed on the layer of insulating material 117 to planarize its upper surface.

Figure 3E:
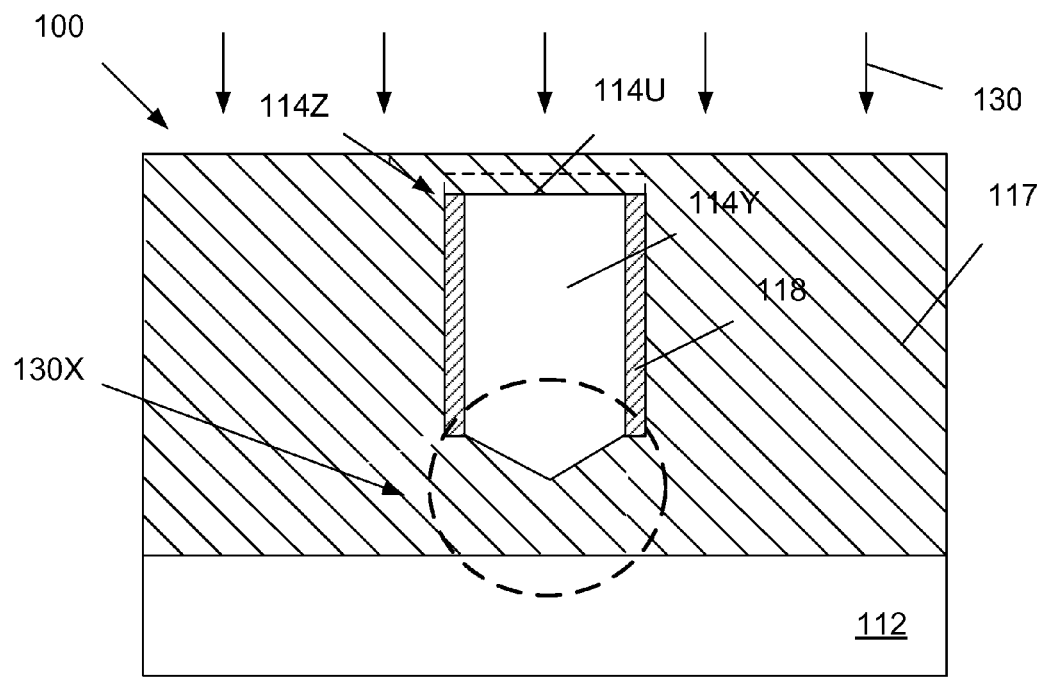

FIG. 3E depicts the device 100 after a fin oxidation thermal anneal process 130 was performed on the FinFET device 100 in an oxidizing process ambient. In general, in one embodiment, the fin oxidation thermal anneal process 130 is performed under conditions such that substantially all of at least the exposed portion 114X of the increased height fin 114Z is converted into an insulating material, e.g., silicon dioxide, as indicated within the region 130X. That is, the fin oxidation thermal anneal process 130 is performed under conditions such that isolation material 130X is formed under the entire axial length (i.e., in the current transport direction) of the remaining upper portion 114Y of the increased height fin 114Z. At this point in the process flow, a gate structure has not yet been formed, thus the isolation material 130X, i.e., the oxidized portion of the increased height fin 114Z, extends under what will become the channel region of the device 100 as well as under what will become the source/drain regions of the device 100. The parameters of the fin oxidation thermal anneal process 130 may vary depending upon the particular application. In one illustrative embodiment, the thermal anneal process 130 may be performed at a temperature that falls within the range of about 400-1200° C. for a duration in an oxidizing processing ambient (wet or dry). In some cases, the fin oxidation thermal anneal process 130 may be performed in an open-air furnace. The fin oxidation thermal anneal process 130 may be performed using an RTA furnace, a laser anneal process or a traditional furnace, depending upon the particular application. The duration of the fin oxidation thermal anneal process 130 may vary depending upon a variety of factors, e.g., it may range from nanoseconds to hours depending upon the particular processing tools and techniques used to perform the anneal process 130, such as an RTA chamber or a traditional furnace. Additionally, the rate of oxidation may be controlled or "tuned" by controlling the thickness of the layer of insulating material 117. It is anticipated that, in all cases, the layer of insulating material 117 will be deposited such that its upper surface is positioned above the upper surface 114U of the increased height fin 114Z and that the thermal anneal process 130 will be performed with the trenches in such an over-filled condition. In general, the layer of insulating material 117 should be deposited such that its upper surface is positioned approximately level with to a few hundred nanometers above the upper surface of the increased height fin 114Z. However, to control the rate of oxidation, the layer of insulating material 117 may be deposited to an even greater thickness to reduce the rate of oxidation of the exposed portion 114X of the increased height fin 114Z.

Figure 3F:
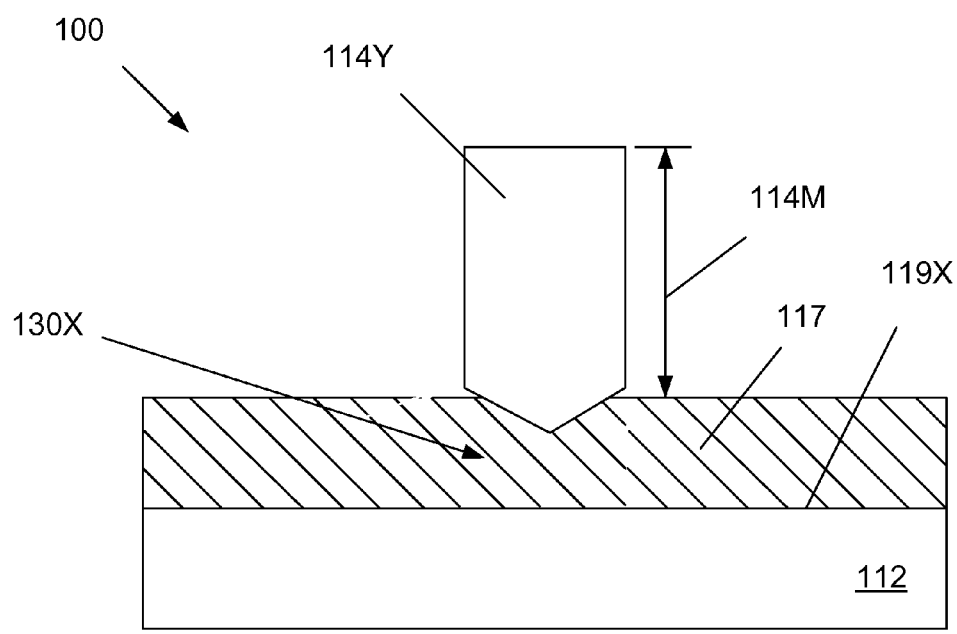

FIG. 3F depicts the FinFET device 100 after several process operations were performed. First, an etching process was performed to recess the layer of insulating material 117 to a desired height such that the desired amount (114M) of the remaining upper portion 114Y of the increased height fin 114Z is exposed above the surface of the layer of insulating material 117. The amount of the layer of insulating material 117 that remains after the recessing ("etch-back") process is performed may vary depending upon the particular application, e.g., 5-10 nm.

Figure 3G:
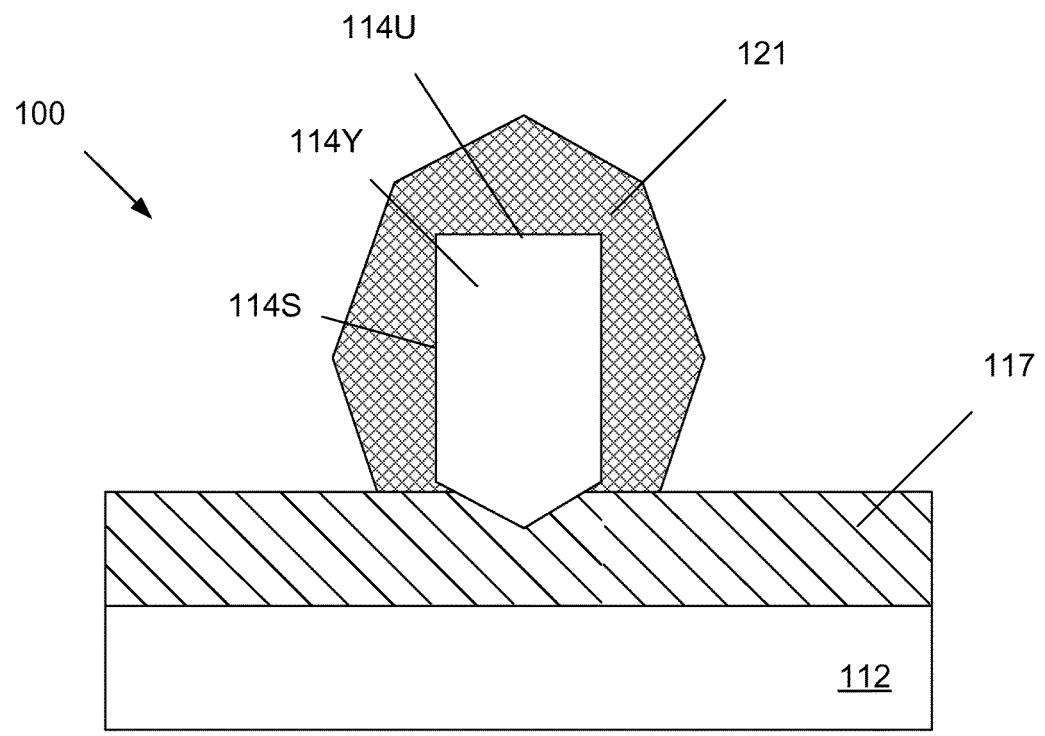

FIG. 3G depicts the device 100 after an epitaxially deposited/grown semiconductor material 121 was formed on the exposed portion of the fin 114Y. As depicted, the semiconductor material 121 has a conformal, cladding-like configuration. In some embodiments, the thickness of the portion of the epi semiconductor material 121 positioned above the upper surface 114U of the fin 114Y may be slightly less than the thickness of the epi semiconductor material 121 positioned adjacent the sidewalls 114S of the fin 114Y. In one example, the epi semiconductor material 121 may be formed to any desired thickness, e.g., a thickness of less than 10 nm. The epi semiconductor material 121 may be formed by performing a traditional epitaxial deposition/growth process. The epi semiconductor material 121 may be comprised of a variety of different materials that are different from the material of the substrate 112, e.g., silicon, silicon/germanium ($Si_xGe_{1-x}$), germanium, silicon phosphorous (SiP), silicon carbon phosphorous (SiCP), germanium tin (GeSn), Si:B, SiGe:B, SiGe:P, SiGe:As, etc. The faceted configuration of the epi semiconductor material 121 shown in FIG. 3G is due to the crystallographic orientation of the substrate 112.

As noted above, in the case of the 45 degree rotated (100) substrate 112 embodiment, the long axis 114L of the fins 114 will be oriented in the <100> direction of the rotated (100) substrate 112. In the case of the non-rotated (110) substrate (zero degrees of rotation) embodiment, the long axis 114L of the fins 114 will be oriented in the <110> direction of the non-rotated (110) substrate. In both of those cases, the cross-sectional views shown herein, the sidewalls 114S of the fin 114 are substantially positioned in the <100> crystallographic direction of the substrate 112 for either the 45 degree rotated (100) substrate or the non-rotated (110) substrate. Such an orientation promotes the formation of a more uniform epi material 121. However, as noted above, the inventions disclosed herein are not limited to use with any particular type of substrate with any particular crystalline structure or to the orientation of the fins 114 on such a substrate relative to the crystallographic orientation of the substrate material.

Figure 3H:
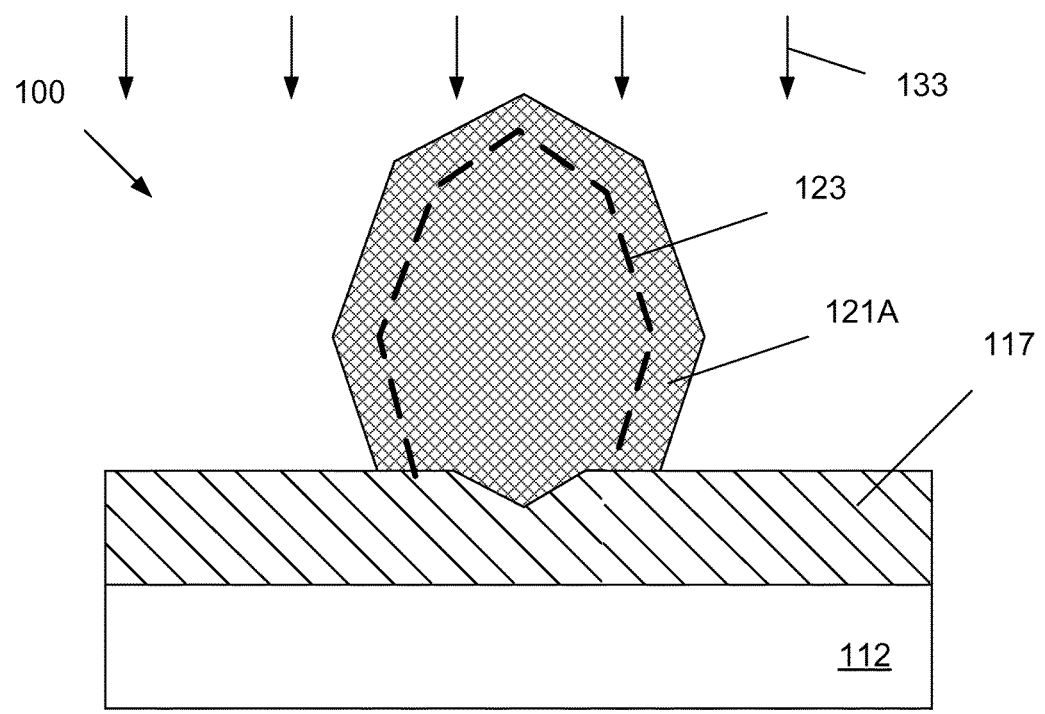

FIG. 3H depicts the device 100 after an optional fin diffusion thermal anneal process 133 was performed on the FinFET device 100. The fin diffusion thermal anneal process 133 may be performed in a non-oxidizing process ambient, e.g., an inert gas ambient, if desired. In general, the purpose of the fin diffusion thermal anneal process 133 is to cause the intermingling or diffusion of the epi semiconductor material 121 (e.g., germanium from the epi material) with or into the remaining portions of the fin 114Y so as to form an intermixed fin structure 121A. In the depicted example, the fin diffusion thermal anneal process 133 is performed under conditions such that substantially all of the underlying fin 114Y is intermingled with the epi semiconductor material 121, but complete intermixing may not occur or be required in all applications. The parameters of the fin diffusion thermal anneal process 133 may vary depending upon the particular application. In one illustrative embodiment, the fin diffusion thermal anneal process 133 may be performed at a temperature that falls within the range of about 500-800° C. In some cases, the fin diffusion thermal anneal process 133 may be performed in an open-air furnace. The fin diffusion thermal anneal process 133 may be performed using an RTA furnace, a laser anneal process or a traditional furnace, depending upon the particular application. The duration of the fin diffusion thermal anneal process 130 may vary depending upon a variety of factors, e.g., it may range from nanoseconds to hours depending upon the particular processing tools and techniques used to perform the fin diffusion thermal anneal process 133, such as an RTA chamber or a traditional furnace.

Additionally, in addition to performing the above-described fin diffusion thermal anneal process 133, wherein substantially only diffusion of the epi semiconductor material 121 into the remaining portions of the fin 114Y occurs, a fin condensation thermal anneal process (not separately identified with a reference number) may be performed on the product shown in FIG. 3G, i.e., after the epi semiconductor material 121 was formed. Such a fin condensation thermal anneal process may be performed at approximately the same temperature and for approximately the same duration as discussed above for the fin diffusion thermal anneal process 133. However, the fin condensation thermal anneal process must be performed in an oxidizing processing ambient. During the fin condensation thermal anneal process, the above-described intermixing of the material from the epi material 121 occurs and some of the outer portions of the overall fin structure is oxidized, thereby producing a thinner, more condensed fin. A dashed line 123 in FIG. 3H depicts an illustrative example of what the outer perimeter of a condensed fin structure would look like after the fin condensation thermal anneal process was performed.

Figure 3I:
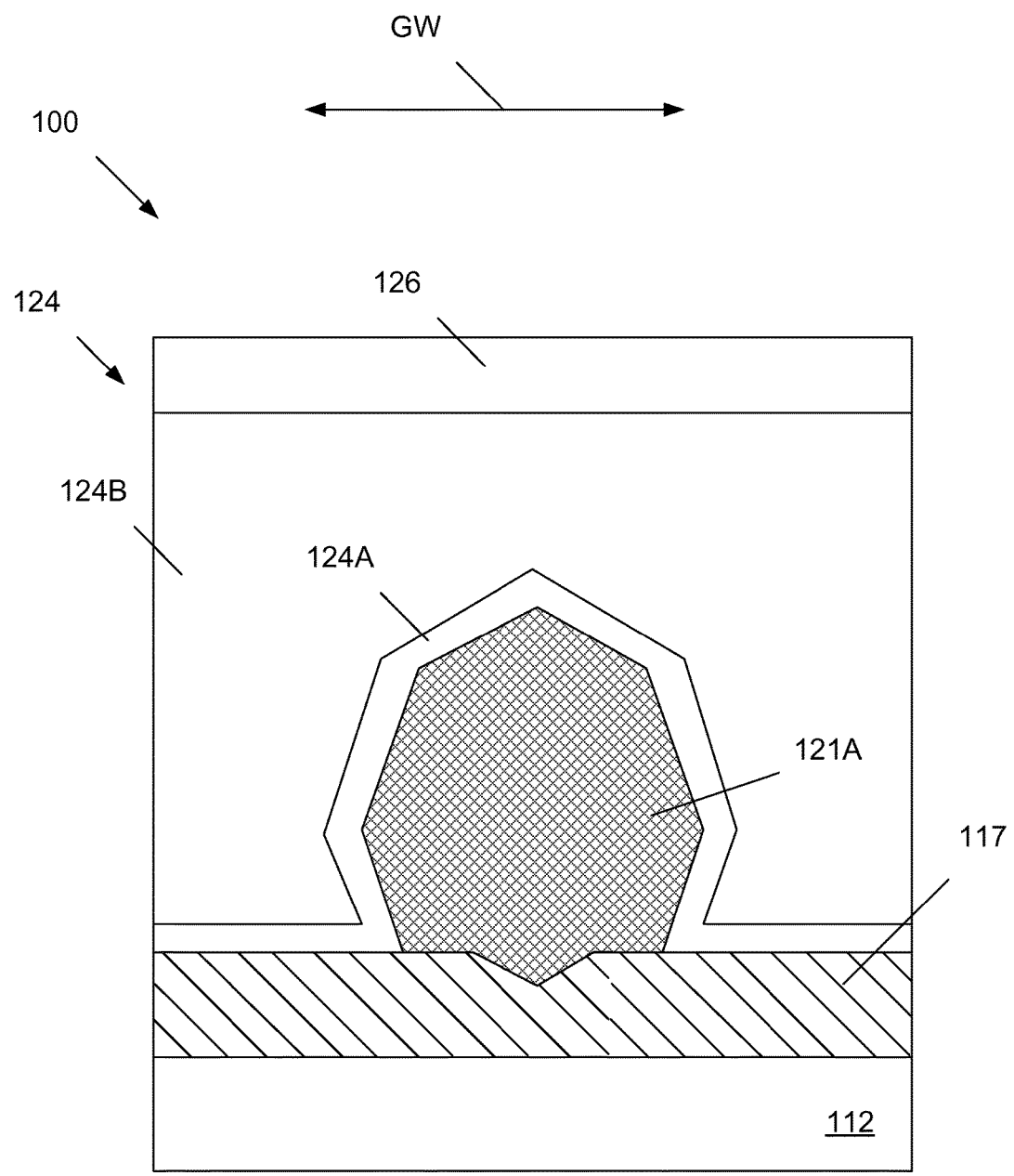

At this point, traditional manufacturing operations may be performed to complete the fabrication of the illustrative FinFET device 100, e.g., gate formation, source/drain formation, contact formation, metallization, etc. FIG. 3I is a cross-sectional view taken through the channel region of the device (in the gate-width (GW) direction) after an illustrative gate structure 124 and a gate cap layer 126 were formed on the device FinFET 100 above the condensed fin structure 121A. The gate structure 124 is intended to be representative in nature of any gate structure that may be formed on semiconductor devices. The illustrative gate structure 124 may be formed using well-known techniques. i.e., gate-first or replacement gate techniques. Of course, the materials of construction used for the gate structure 124 on a P-type device may be different than the materials used for the gate structure 124 on an N-type device. In one illustrative embodiment, the schematically depicted gate structure 124 includes an illustrative gate insulation layer 124A and an illustrative gate electrode 124B. The gate insulation layer 124A may be comprised of a variety of different materials, such as, for example, silicon dioxide, a so-called high-k (k greater than 7) insulation material (where k is the relative dielectric constant), etc. The thickness of the gate insulation layer 124A may also vary depending upon the particular application, e.g., it may have a physical thickness of about 1-2 nm. Similarly, the gate electrode 124B may also be of a variety of conductive materials, such as polysilicon or amorphous silicon, or it may be comprised of one or more metal layers that act as the gate electrode. As will be recognized by those skilled in the art after a complete reading of the present application, the gate structure 124 depicted in the attached drawings, i.e., the gate insulation layer and the gate electrode, are intended to be representative in nature. That is, the gate structure 124 may be comprised of a variety of different materials and they may have a variety of configurations. In one illustrative embodiment, a deposition process may be performed to form a gate insulation layer comprised of a high-k layer of insulating material, $HfO_2$, $Al_2O_3$, etc. Thereafter, the gate electrode material and the gate cap layer material may be deposited above the FinFET device 100 and the layers may be patterned using known photolithographic and etching techniques. In another illustrative embodiment, a conformal CVD or ALD process may be performed to form a gate insulation layer comprised of, for example, hafnium oxide. Thereafter, one or more metal layers (that will become the gate electrode) and a gate cap layer material (not shown) may be deposited above the FinFET device 100. The gate cap layer 126 may be made of a variety of different materials, e.g., silicon nitride, etc.

Figure 3J:
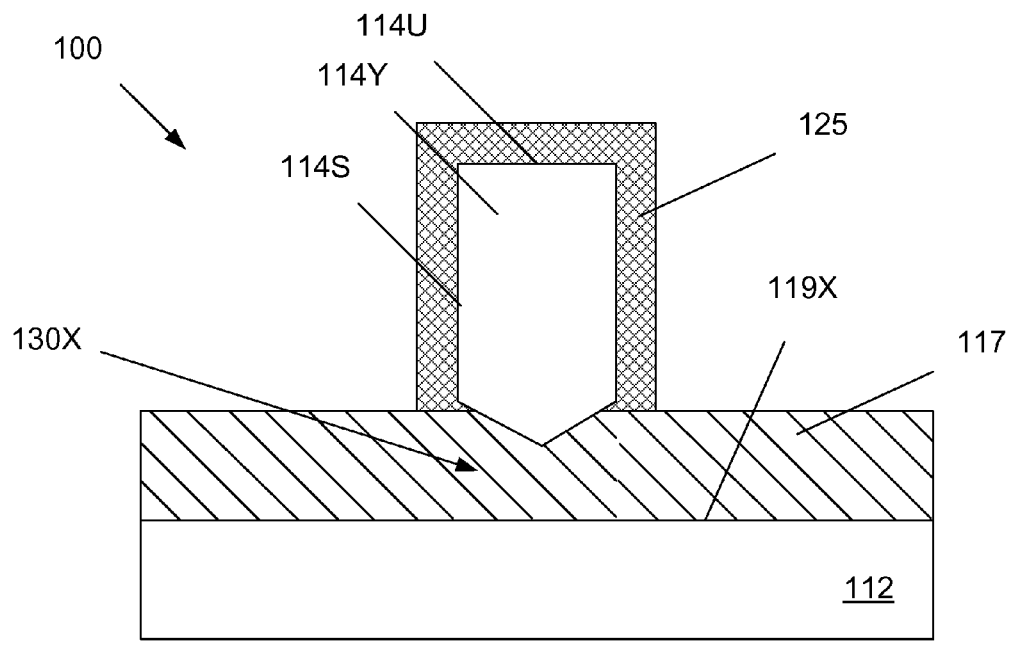
Figure 3K:
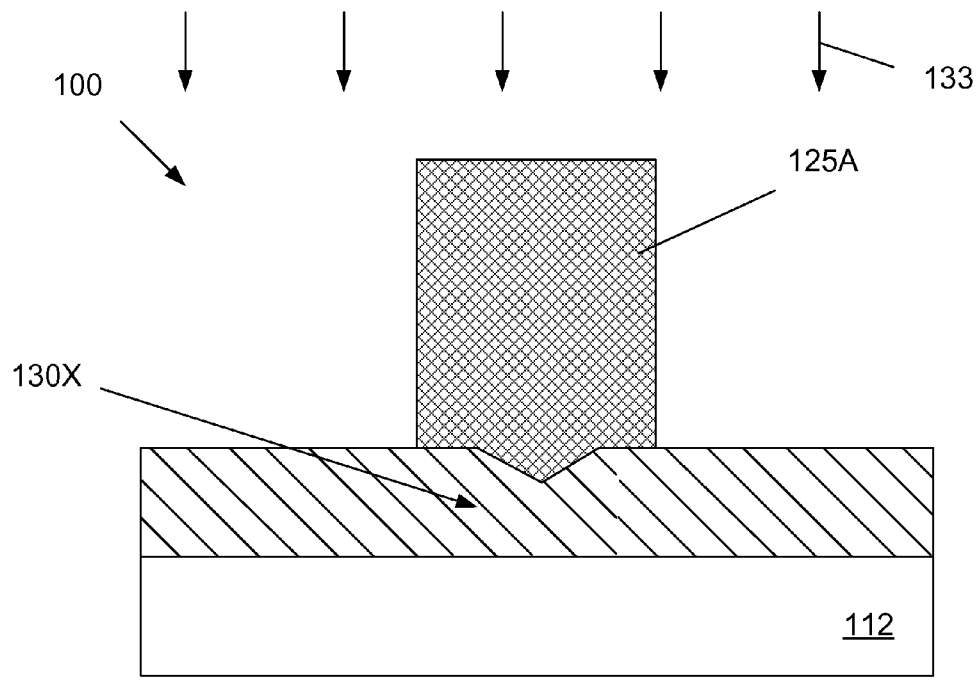
Figure 3L:
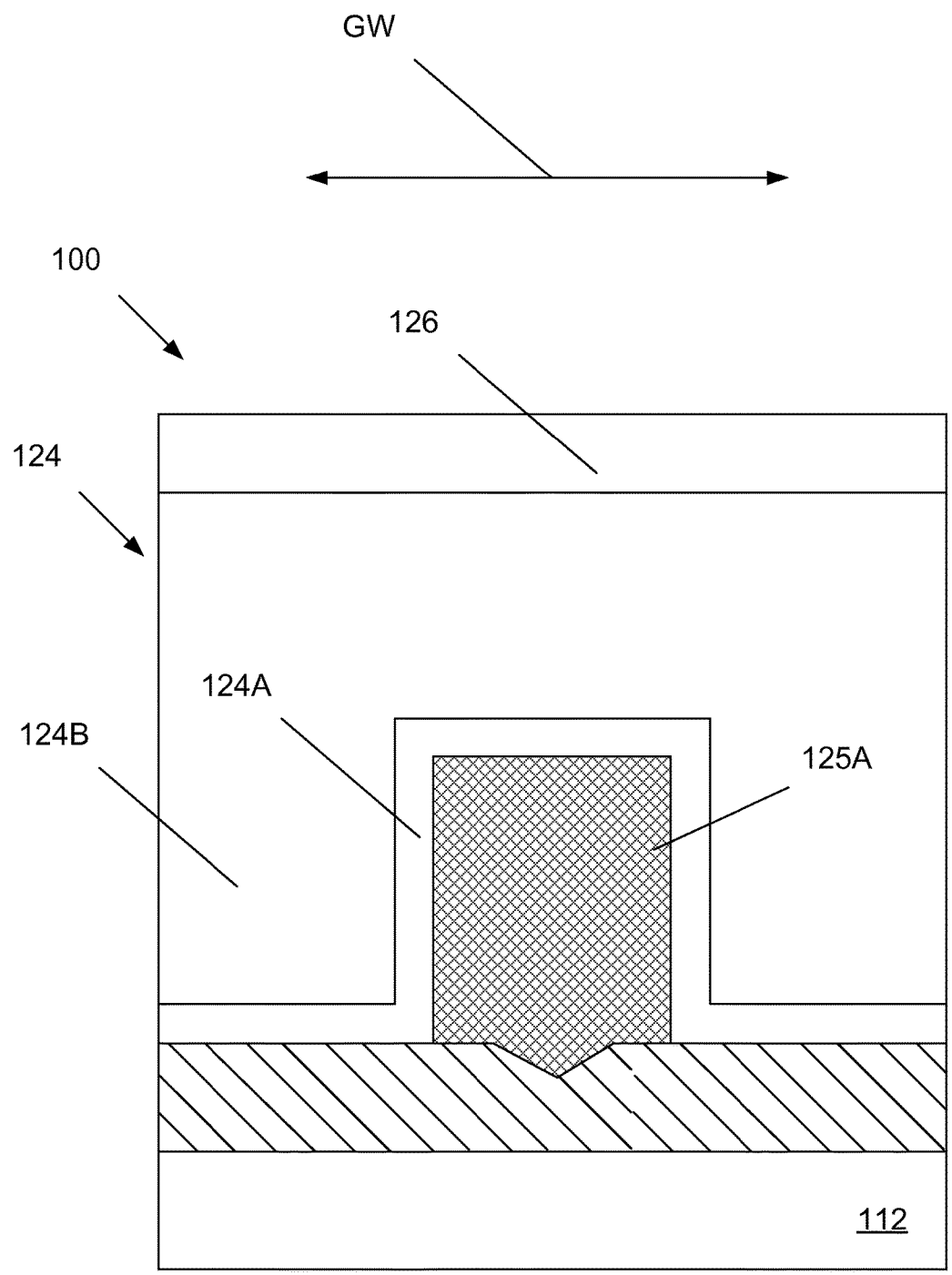

FIGS. 3J-3L depict an illustrative embodiment where the FinFET device 100 is formed on a rotated (100) substrate 112, as shown in FIG. 2D. In this example, the sidewalls 114S of the fin are oriented in the <100> crystallographic direction of the substrate 112.

FIG. 3J depicts the device 100 after several process operations were performed. First, the final trenches 119X were overfilled with the insulating material 117. Thereafter, the above-described fin oxidation thermal anneal process 130 was performed to convert substantially all of at least the exposed portion 114X of the increased height fin 114Z into insulating material 130X. As with the above example, at this point in the process flow, a gate structure has not yet been formed, thus the isolation material 130X, i.e., the oxidized portion of the fin 114, extends under what will become the channel region of the device 100 as well as under what will become the source/drain regions of the device 100. Then, an etching process was performed to recess the layer of insulating material 117 to a desired height such that the desired amount of the remaining upper portion 114Y of the increased height fin 114Z is exposed above the recessed surface of the layer of insulating material 117. Next, an epitaxially deposited/grown semiconductor material 125 was formed on the exposed portion of the fin 114Y. In this case, the epi semiconductor material 125 may have a box-like configuration due to the crystallographic orientation of the substrate 112. In some embodiments, the thickness of the portion of the epi semiconductor material 125 positioned above the upper surface 114U of the fin 114Y may be slightly less than the thickness of the epi semiconductor material 125 positioned adjacent the sidewalls 114S of the fin 114Y. The epi semiconductor material 125 may be formed by performing a traditional epitaxial deposition/growth process, and it may be one of the materials described above for the epi semiconductor material 121.

FIG. 3K depicts the device 100 after the above-described optional fin diffusion thermal anneal process 133 was performed to cause the intermingling or diffusion of the epi semiconductor material 125 with or into the remaining portions of the fin 114Y so as to form an intermixed fin structure 125A. In the depicted example, the fin diffusion thermal anneal process 133 is performed under conditions such that substantially all of the underlying fin 114Y is intermingled with the epi semiconductor material 125, but complete intermixing may not occur or be required in all applications. As before, if desired, the above-described fin condensation thermal anneal process may be performed after performing the fin diffusion thermal anneal process 133.

At this point, traditional manufacturing operations may be performed to complete the fabrication of the illustrative FinFET device 100, e.g., gate formation, source/drain formation, contact formation, metallization, etc. FIG. 3L is a cross-sectional view taken through the channel region of the device (in the gate-width (GW) direction) after the above-described illustrative gate structure 124 and the above-described gate cap layer 126 were formed on the device FinFET 100 above the condensed fin structure 125A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
performing at least one first etching process to form a plurality of initial trenches having an initial depth in a semiconductor substrate, said initial trenches defining an initial fin structure having sidewalls with an initial exposed height;
forming a protection layer on at least said sidewalls of said initial fin structure;
after forming said protection layer, performing a second etching process to extend said initial depth of said initial trenches into said substrate and thereby form a plurality of final trenches having a final depth that is greater than said initial depth and to define an increased-height fin structure that has an overall height greater than said height of said initial fin structure;
forming a layer of insulating material so as to over-fill said final trenches;
with said layer of insulating material over-filling said final trenches, and with said protection layer in position on at least said sidewalls, performing a fin oxidation thermal anneal process to convert at least a portion of said increased-height fin structure into an isolation material that extends under an entire axial length of said increased-height fin structure in a gate length direction of said device and to define a remaining portion of said increased fin-height structure above said isolation material;
after performing said fin oxidation thermal anneal process, removing said protection layer;
performing an epitaxial deposition process to form a layer of semiconductor material on at least portions of said remaining portion of said increased fin-height structure; and
performing a thermal process to cause diffusion of material of said layer of semiconductor material with said remaining portion of said increased-height fin structure.

2. The method of claim 1, wherein forming said layer of insulating material so as to over-fill said final trenches comprises forming a layer of silicon dioxide so as to over-fill said final trenches such that an upper surface of said layer of insulating material is positioned above an upper surface of said increased-height fin structure.

3. The method of claim 1, wherein performing said fin oxidation thermal anneal process comprises performing said thermal anneal process at a temperature that falls within the range of 400-1200° C.

4. The method of claim 3, wherein performing said fin oxidation thermal anneal process comprises performing said fin oxidation thermal anneal process in an oxidizing process ambient.

5. The method of claim 1, wherein said substrate is a silicon substrate and wherein said layer of semiconductor material is a semiconductor material that is different than silicon.

6. The method of claim 1, wherein said substrate is a silicon substrate and wherein said layer of semiconductor material is a silicon-germanium (SixGe1-x) material.

7. The method of claim 1, wherein performing said fin oxidation thermal anneal process to convert at least a portion of said increased-height fin structure into said isolation material comprises performing said fin oxidation thermal anneal process such that said isolation material extends under the entire width, in a gate width direction of said device, of said initial fin structure.

8. The method of claim 7, wherein performing said fin oxidation thermal anneal process to convert at least a portion of said increased-height fin structure into said isolation material comprises performing said fin oxidation thermal anneal process to convert said increased-height fin structure into a silicon dioxide isolation material.

9. The method of claim 1, wherein performing said thermal process comprises performing a fin diffusion thermal anneal process in a non-oxidizing process ambient at a temperature that falls within a range of 400-1200° C. to cause said diffusion.

10. The method of claim 1, wherein performing said thermal process comprises performing a fin condensing thermal anneal process in an oxygen ambient at a temperature that falls within a range of 400-1200° C. to cause said diffusion and to oxidize a portion of said layer of semiconductor material to thereby define a condensed fin structure.

11. The method of claim 10, wherein, after performing said fin condensing thermal anneal process, forming a gate structure around said condensed fin structure.

12. The method of claim 1, further comprising forming a gate structure around said layer of semiconductor material.

13. A method of forming a FinFET device, comprising:
performing at least one first etching process to form a plurality of initial trenches having an initial depth in a silicon substrate, said initial trenches defining an initial fin structure having sidewalls with an initial exposed height;
forming a protection layer comprised of silicon nitride on at least said sidewalls of said initial fin structure;
after forming said protection layer, performing a second etching process to extend the initial depth of said initial trenches into said substrate and thereby form a plurality of final trenches having a final depth that is greater than said initial depth and to define an increased-height fin structure that has an overall height greater than said height of said initial fin structure;
forming a layer of silicon dioxide so as to over-fill said final trenches;
with said layer of silicon dioxide over-filling said final trenches, and with said protection layer in position on at least a portion of said sidewalls, performing a fin oxidation thermal anneal process to convert at least a portion of said increased-height fin structure into silicon dioxide isolation material that extends under an entire axial length of said increased-height fin structure in a gate length direction of said device and to define a remaining portion of said increased fin-height structure above said silicon dioxide isolation material, wherein said silicon dioxide isolation material extends under an entire width, in a gate width direction of said device, of said remaining portion of said increased fin-height structure;
after performing said fin oxidation thermal anneal process, removing said protection layer;
performing an epitaxial deposition process to form a layer of semiconductor material on at least portions of said remaining portion of said increased fin-height structure; and
performing a thermal process to cause diffusion of material of said layer of semiconductor material with said remaining portion of said increased-height fin structure.

14. The method of claim 13, wherein forming said layer of silicon dioxide so as to over-fill said final trenches comprises forming a layer of silicon dioxide so as to over-fill said final trenches such that an upper surface of said layer of silicon dioxide is positioned above an upper surface of said increased-height fin structure.

15. The method of claim 13, wherein performing said fin oxidation thermal anneal process comprises performing said thermal anneal process at a temperature that falls within the range of 400-1200° C.

16. The method of claim 15, wherein performing said fin oxidation thermal anneal process comprises performing said fin oxidation thermal anneal process in an oxidizing process ambient.

17. The method of claim 13, wherein said layer of semiconductor material is silicon-germanium ($Si_xGe_{1-x}$).

18. The method of claim 13, wherein performing said thermal process comprises performing a fin diffusion thermal anneal process in a non-oxidizing process ambient at a temperature that falls within a range of 400-1200° C. to cause said diffusion.

19. The method of claim 18, wherein, after performing said fin diffusion thermal anneal process, forming a gate structure around said fin structure.

20. The method of claim 13, further comprising forming a gate structure around said layer of semiconductor material.

21. The method of claim 13, wherein performing said thermal process comprises performing a fin condensing thermal anneal process in an oxygen ambient at a temperature that falls within a range of 400-1200° C. to cause said diffusion and to oxidize a portion of said layer of semiconductor material to thereby define a condensed fin structure.

22. The method of claim 21, wherein, after performing said fin condensing thermal anneal process, forming a gate structure around said condensed fin structure.

* * * * *